(12) United States Patent
Behringer et al.

(10) Patent No.: US 7,271,419 B2
(45) Date of Patent: Sep. 18, 2007

(54) LASER DEVICE HAVING A PLURALITY OF EMISSION ZONES

(75) Inventors: Martin Behringer, Regensburg (DE); Johann Luft, Wolfsegg (DE); Bruno Acklin, Mountain View, CA (US)

(73) Assignee: Osram Opto Semiconductor GmbH, Regensburg (DE)

( * ) Notice: Subject to any disclaimer, the term of this patent is extended or adjusted under 35 U.S.C. 154(b) by 267 days.

(21) Appl. No.: 10/926,903

(22) Filed: Aug. 27, 2004

(65) Prior Publication Data

US 2005/0087735 A1    Apr. 28, 2005

(30) Foreign Application Priority Data

Aug. 29, 2003  (DE) ................................. 103 40 269
Jan. 23, 2004  (DE) ....................... 10 2004 003 524

(51) Int. Cl.
*H01L 29/18* (2006.01)
(52) U.S. Cl. ................. 257/88; 257/E33.075; 372/50.1
(58) Field of Classification Search ................... 257/98, 257/99, E33.058, E33.075, 88, E33.012; 372/50.1, 50.121, 50.12
See application file for complete search history.

(56) References Cited

U.S. PATENT DOCUMENTS 4,831,630 A    5/1989    Scifres et al.

FOREIGN PATENT DOCUMENTS

| CA | 2 356 323 A1 | 5/2001 |
|---|---|---|
| DE | 198 21 544 A1 | 12/1999 |
| DE | 199 52 712 A1 | 5/2001 |
| DE | 100 57 698 A1 | 6/2002 |
| EP | 0 064 339 A1 | 4/1982 |
| JP | 11346031 A | 12/1999 |

OTHER PUBLICATIONS

OEL paper, www.eng.warwick.ac.uk/espbc/courses/undergrad/lec5/diode-example.htm. Nov. 26, 2002.
J.P. van der Ziel et al., "Integrated multilayer GaAs lasers separated by tunnel junctions", Applied Phys. Letters, vol. 41, No. 6, pp. 499-501, 1982.

*Primary Examiner*—Minh-Loan Tran
(74) *Attorney, Agent, or Firm*—Cohen Pontani Lieberman & Pavane LLP

(57) ABSTRACT

A laser device having a semiconductor body (1), which has a plurality of active layers (5, 9) arranged vertically one above the other and serving for generating laser radiation. The active layers are subdivided in the transverse direction into a plurality of emission zones (15) and are electrically connected in series in the vertical direction. The semiconductor body (1) is formed in monolithic integrated fashion, and a cooling element (2) is provided on which the semiconductor body (1) is arranged.

15 Claims, 3 Drawing Sheets

LASER DEVICE HAVING A PLURALITY OF EMISSION ZONES

RELATED APPLICATIONS

This patent application claims the priority of German patent applications 103 40 269.1 filed Aug. 29, 2003 and 10 2004 003 524.5 filed Jan. 23, 2004, the disclosure content of which is hereby incorporated by reference.

FIELD OF THE INVENTION

The invention relates to a laser device having a semiconductor body, which has a plurality of emission zones in the lateral direction.

BACKGROUND OF THE INVENTION

Laser diodes are known in the form of so-called laser bars having an active radiation-generating layer that is subdivided into a plurality of parallel, strip-type emission zones transversely arranged with respect to the emission direction. See for example, EP 0 064 339 A1. Laser diodes of this type are usually contacted by means of two contact areas extending laterally over all the emission zones, so that the individual strip-type emission zones are electrically connected in parallel. By virtue of the parallel arrangement of the emission zones, it is possible to achieve a particularly high optical power in comparison with a laser diode having a single emission zone, with the result that laser bars of this type are suitable in particular for high-power applications.

Cooling is accorded particular importance in the case of high-power laser diodes. Without adequate cooling, the resulting heat loss would lead to a major rise in temperature, so that the semiconductor body would be thermally overloaded and consequently destroyed within a very short time. For cooling purposes, the semiconductor body of the laser diode may be mounted for example onto a metal plate with sufficient thermal capacity and thermal conductivity.

In order to achieve even higher optical powers, such laser bars with respective cooling elements can be stacked vertically one above the other. However, such a device requires a comparatively high outlay on materials and production complexity since each semiconductor body is, first of all, mounted onto the respective cooling element and then the cooling element together with the semiconductor body fixed thereon are stacked one above the other. Each of these mounting steps has to be performed with high precision in order to ensure that all emission zones are aligned exactly with one another. Furthermore, the emission zones are at a comparatively large vertical distance from one another because of the cooling elements situated in between, said distance making it more difficult to focus the generated radiation onto a common center. However, particularly for pump applications with high powers, it is essential that the generated radiation can be focused as well as possible.

SUMMARY OF THE INVENTION

One object of the present invention is to provide a laser device of the type mentioned in the introduction with a high output power. In particular, the laser device is intended to be suitable for pump applications and furthermore to be able to be produced with the least possible technical outlay.

This and other objects are attained in accordance with one aspect of the invention directed to a laser device having a semiconductor body, which has a plurality of active layers arranged vertically one above the other for generating laser radiation. The active layers are subdivided in the transverse direction into a plurality of emission zones and are electrically connected in series, in the vertical direction. The semiconductor body is formed in monolithic integrated fashion and is arranged on a cooling element.

By virtue of the monolithic integration of a plurality of active layers that are stacked one above the other in the vertical direction, in accordance with an embodiment of the invention, the distance between the active layers is significantly reduced in comparison with a conventional discrete construction, and the focusability of the radiation generated in the individual active layers onto a common center is thus improved. This is advantageous particularly for pump applications.

Thus, by way of example, the distance between two active layers that are adjacent in the vertical direction, in accordance with an embodiment of the invention, is less than 100 µm, preferably less than 20 µm, preferably less than 5 µm, while in the case of known discrete arrangements said distance is substantially determined by the dimensions of the cooling elements and typically lies in the mm range.

Furthermore, by virtue of the monolithic fabrication of the semiconductor body, an exact alignment of the emission zones with one another is already achieved in the context of producing the semiconductor body without the need for a subsequent separate and complex alignment.

In accordance with an embodiment of the invention, only a single common cooling element is required for the entire laser device, with the result that the material costs are advantageously low in comparison with a discrete arrangement of stacked cooling elements with laser bars respectively mounted thereon.

The active layers arranged vertically one above the other can be electrically connected in series by means of a tunnel junction. In accordance with an embodiment of the invention, a series connection by means of a tunnel junction also encompasses the arrangement of a contact layer or a contact layer stack between two active layers that are adjacent in the vertical direction, the contact layer stack comprising a first conductive layer of a first conduction type, a second conductive layer of a second conduction type and an intermediate layer, the intermediate layer being arranged between the first and second conductive layers and increasing the tunneling probability for charge carriers.

In this case, the intermediate layer has the advantage that the charge carrier absorption and the scattering at ionized defects in it are reduced, with the result that the charge carriers have higher lifetimes and the electrical resistance is thus reduced. The reduced electrical resistance has the effect that the conductive contact remains stable and is not destroyed even in the event of extreme current loading. As a result, the lifetime of the laser device is advantageously prolonged. Preferably, the intermediate layer is undoped. An undoped (intrinsic) layer has the advantage that the charge carrier absorption and the scattering of charge carriers at ionized defects directly in the junction region are reduced. As a result, the charge carriers have an increased lifetime, with the result that the electrical resistance of the conductive contact layer stack is reduced. The intermediate layer is advantageously formed such that it is relatively thin. It may have a thickness of between one monolayer and 50 nm.

In a further embodiment of such an intermediate layer, it is provided that the intermediate layer is doped with the first or the second conduction type, but has a lower dopant concentration than the first or second conductive layer.

Moreover, it is possible to realize a series connection by means of a tunnel junction in accordance with an embodiment of the invention also by virtue of the fact that a contact layer stack is arranged between two active layers that are adjacent in the vertical direction, the contact layer stack having a first conductive layer of a first conduction type, a second conductive layer of a second conduction type, a first intermediate layer and a second intermediate layer, the first and second intermediate layers being arranged between the first and second conductive layers, and the first intermediate layer facing the first conductive layer and the second intermediate layer facing the second conductive layer. Preferably, the first intermediate layer has the same conduction type as the first conductive layer and has a higher dopant concentration than the first conductive layer, while the second intermediate layer has the same conduction type as the second conductive layer and has a higher dopant concentration than the second conductive layer. The thickness of the first and/or the second intermediate layer further preferably lies between one monolayer and 30 nm, in particular between 4 nm and 12 nm.

The abovementioned contact layer stacks are described in commonly assigned U.S. application Ser. No. 10/432,187 which is hereby incorporated by reference in the present patent application.

In an embodiment of the invention, the active layers are in each case embedded in a wave guide structure, which is formed for example as an LOC wave guide (large optical cavity). As a result, the radiation field is concentrated onto the active layer in the vertical direction (optical confinement) and a high efficiency of the component or an advantageously low threshold current is thus achieved.

A further embodiment of the invention involves the fact that the semiconductor body is soldered or adhesively bonded onto the cooling element. An example of a suitable adhesive is a thermally conductive adhesive which, more widely, may also be electrically conductive, for example an epoxide-based adhesive with metal particles, for instance made of gold or silver.

A soldering connection is usually distinguished by even higher thermal and electrical conductivity by comparison with an adhesive bonding connection. However, the semiconductor body is thermally stressed during the soldering process, in which case temperature changes may give rise to mechanical stresses that increase the risk of damage to the semiconductor body or of inadequate mechanical strength.

As an alternative, the semiconductor body may also be clamped onto the cooling element, a means for improving the electrical and/or contact of semiconductor body and cooling element preferably being introduced between semiconductor body and cooling element. A means containing carbon nanotubes is particularly suitable for this purpose.

The cooling element used may be, in particular, a microchannel cooler. Such, for example, water-cooled, cooling elements enable the resulting heat loss to be transported away particularly efficiently. Overall, the invention thus makes it possible to realize optical output powers of more than 100 W, for example in the kilowatts range.

With regard to the focusing of the generated radiation, an optical system may be arranged on the cooling element, which optical system, e.g. in the form of a cylindrical lens, is arranged downstream of the emission zones in the radiating direction. Preferably, such an optical system may be mounted onto the cooling element in the context of fabricating the laser device, so that in this case the optical system and semiconductor body are already aligned with one another and a repeated separate positioning and alignment of the components with respect to one another are not necessary.

DETAILED DESCRIPTION OF THE DRAWINGS

Identical elements or elements acting in the same way are provided with the same reference symbols in the figures.

Figure 1:
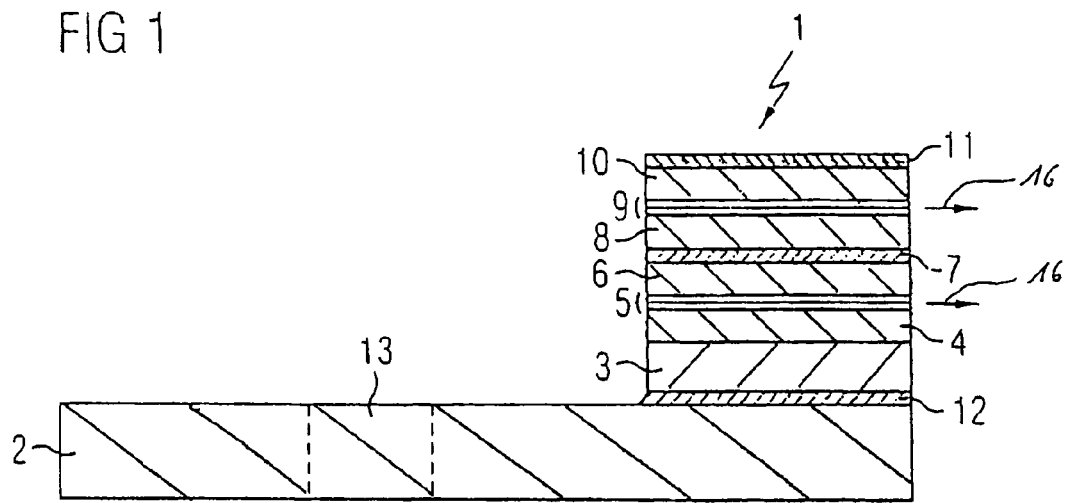
FIG. 1 shows a diagrammatic sectional view of a first exemplary embodiment of a laser device according to the invention taken along lines I-I in FIG. 2.
Figure 2:
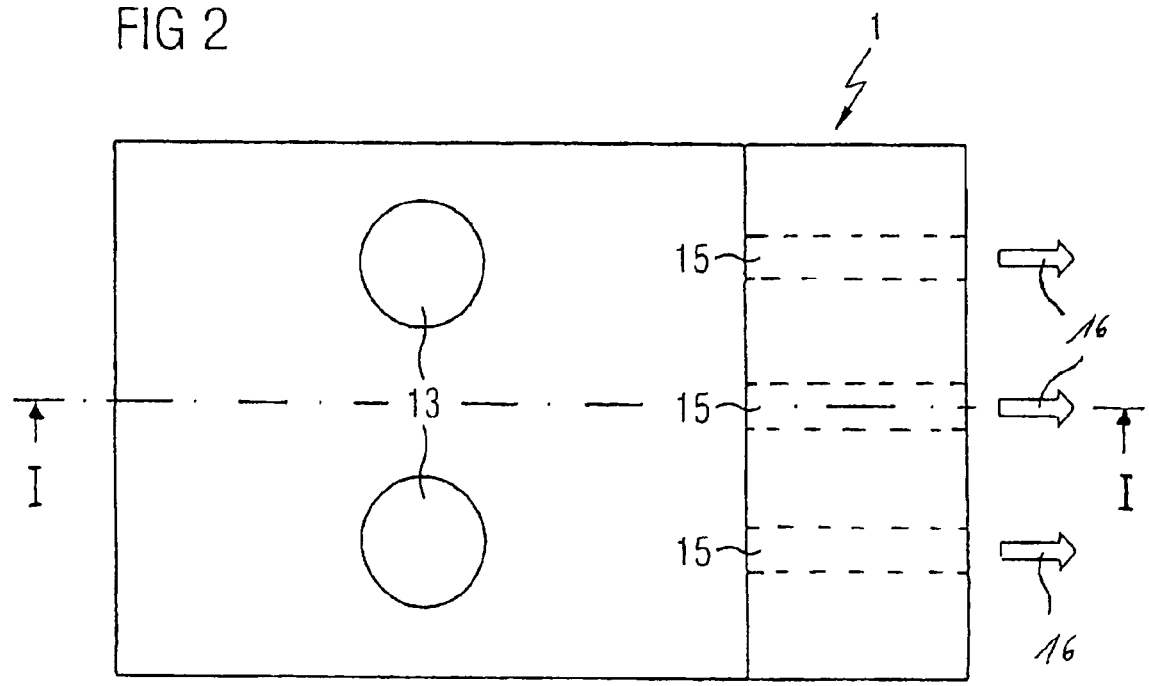
FIG. 2 shows a diagrammatic plan view of the first exemplary embodiment of a laser device according to the invention.

The laser device shown in FIGS. 1 and 2 comprises a semiconductor body 1, which is fixed on a cooling element 2 by means of an adhesion layer 12. By way of example, the semiconductor body 1 can be soldered or adhesively bonded onto the cooling element 2.

The semiconductor body 1 itself is of multilayered construction and has, as seen from the cooling element 2, a substrate 3, a first wave guide layer 4, a first active layer or layer sequence 5, a second wave guide layer 6, a tunnel junction 7, a third wave guide layer 8, a second active layer or layer sequence 9, a fourth wave guide layer 10 and a contact layer or contact layer stack 11.

The active layers 5 and 9 are in each case formed as quantum well structures, for example in the form of a double quantum well structure (DQW) based on InGaAs or based on AlInGaAs with an emission wave length of 808 nm. Single or multiple quantum well structures having more than two quantum wells may likewise be provided in the context of the invention.

The first and second wave guide layers 4, 6 and also the third and fourth wave guide layers 8, 10 in each case form an LOC wave guide structure for guiding the generated radiation field (optical confinement), in which the active layer or layer sequence 5, 9 respectively situated in between is embedded.

A tunnel junction 7 is formed between the two wave guide structures. The active layers arranged vertically one above the other are electrically connected in series by means of said tunnel junction 7.

The cooling element 2 furthermore has holes 13 for fixing the laser device. More widely, the cooling element 2 may be provided with, for example, connection pieces for supplying and discharging a cooling medium and/or electrical terminals for the electrical supply of the semiconductor body.

As shown in FIG. 2, in particular, the active layers 5 and 9 are subdivided transversely into strip-type emission zones that are arranged in parallel and emit light in radiation direction 16. These emission zones 15 may be formed by a corresponding injection of the operating current into the active layers 5 and 9, which may be realized for example by means of a structure of the contact layer or contact layer stack 11 or of a contact metallization that corresponds to the emission zones 15 in the transverse direction. Various techniques are well known for forming such emission zones. One such technique is described in the above-mentioned EP 0 064 389 A1.

As an alternative or in addition, absorber layers for the generated radiation may also be arranged between the emission zones 15. The quality factor of the associated laser resonators is greatly reduced in the region of the absorber layers, so that the generation and propagation of radiation remains limited to the envisaged emission zones 15.

A strip-like waveguide structure can also be used for concentrating the radiation at the emission zones 15. This means, essentially, that the index of refraction varies transversely so that adjacent and parallel waveguides are formed.

Figure 3:
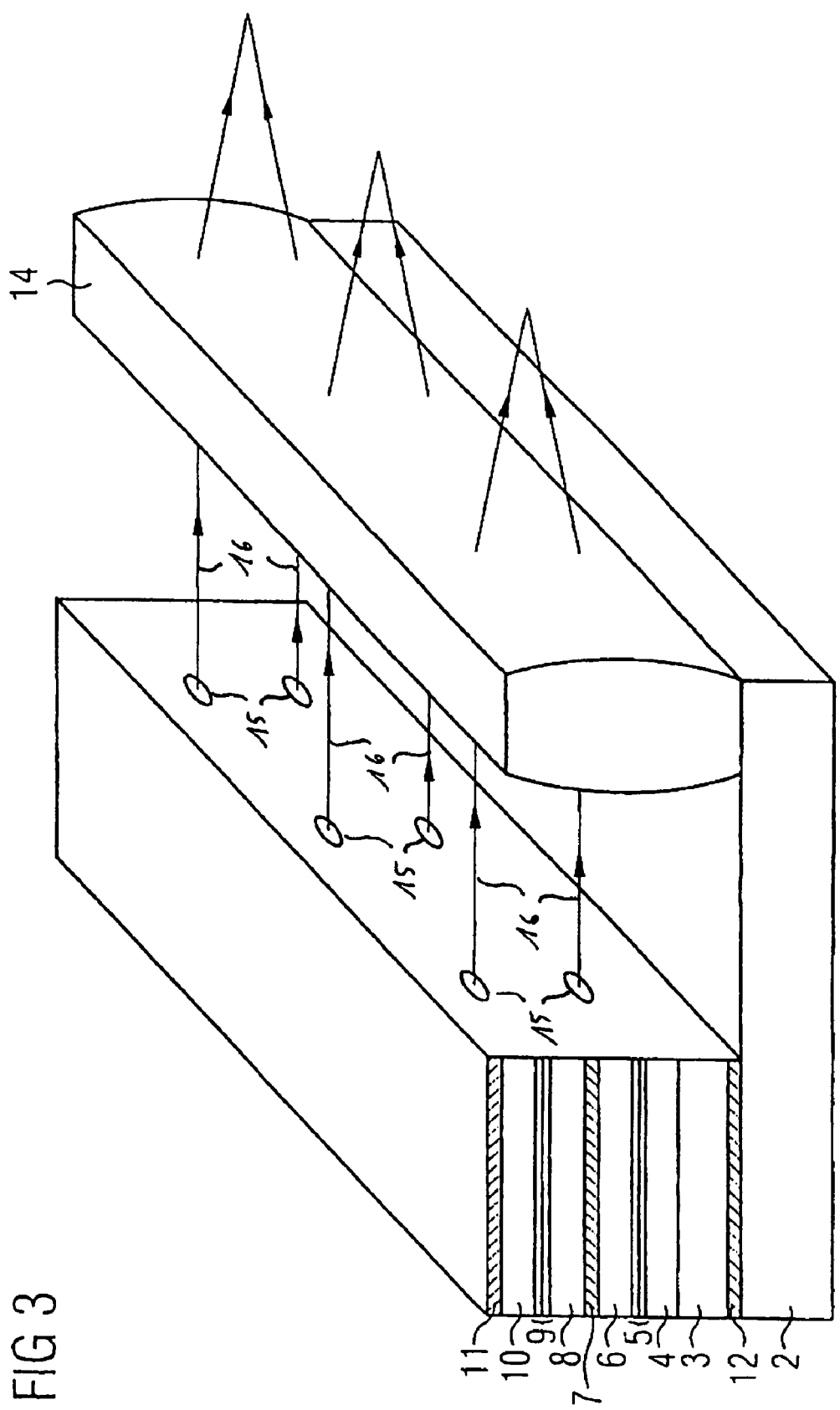
FIG. 3 shows a diagrammatic perspective view of a second exemplary embodiment of the invention.

The laser device illustrated in a perspective view in FIG. 3 largely corresponds to the previously described exemplary embodiment with regard to the semiconductor body 1 and the cooling element 2. In contrast thereto, there is arranged on the cooling element an optical system in the form of a rod-type cylindrical lens 14, which focuses the radiation from the active layers that are respectively stacked one above the other onto a common plane. More widely, it is also possible to provide further optical elements that focus the radiation onto a common center. Instead of the optical system shown, it is also possible to use diffractive optical elements or hybrid arrangements with diffractive optical elements.

Figure 4:
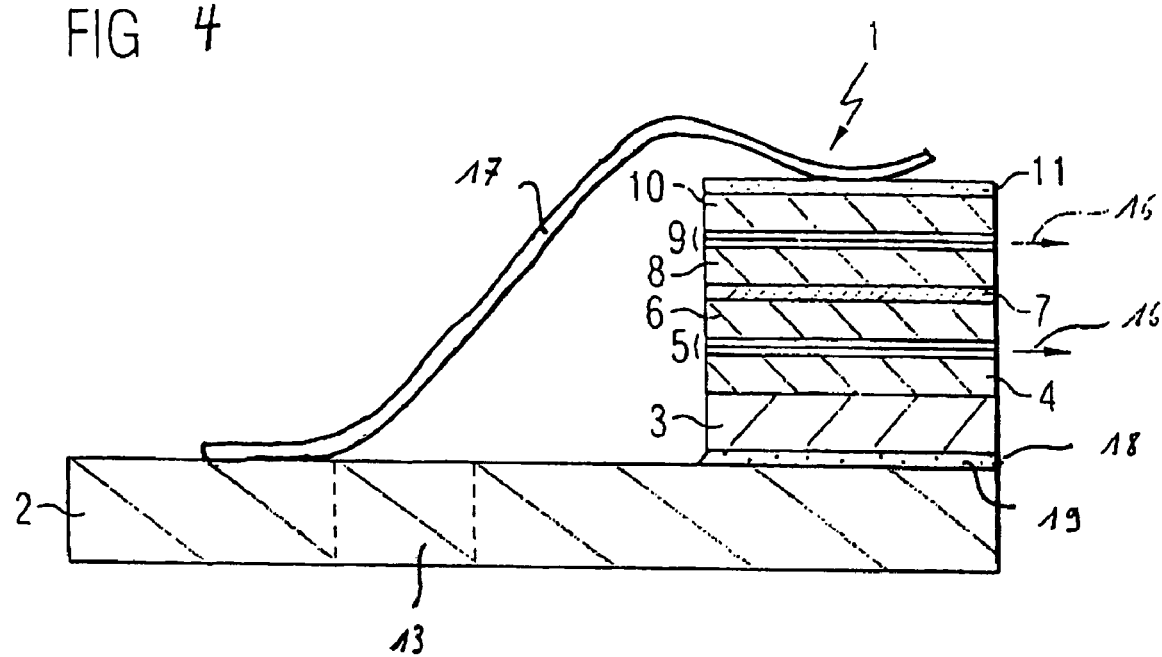
FIG. 4 is similar to FIG. 1, but adds the depiction of carbon nanotubes.

FIG. 4 shows essentially the features of FIG. 1, but with the following differences. FIG. 4 shows semiconductor body 1 clamped onto cooling element 2 by clamp 17. A thin layer 18 containing carbon nanotubes 19 is arranged between semiconductor body 1 and cooling element 2. The carbon nanotubes improve the contact between semiconductor 1 and cooling element 2.

The explanation of the invention on the basis of the exemplary embodiments described above is not to be understood as a restriction thereto. Rather, the invention also encompasses all combinations of the features mentioned in the patent claims and also in the context of the exemplary embodiments and the other descriptions, even if the respective combination is not explicitly the subject matter of a patent claim.

In particular, the invention is not restricted to the number of emission zones shown in the exemplary embodiments, rather it is possible, depending on the application, to stack as many emission zones as desired in the lateral direction and as many active layers as desired in the vertical direction, one on top of the other.

We claim:

1. A laser device comprising:
   a semiconductor body (1), which includes a plurality of active layers (5, 9) arranged vertically one above the other for generating laser radiation, each of said active layers being transversely subdivided into a plurality of emission zones (15), said active layers being electrically connected in series in the vertical direction, wherein said semiconductor body (1) is a monolithic integrated component; and
   a cooling element (2), on which the semiconductor body (1) is arranged.

2. The laser device as claimed in claim 1, in which the active layers (5, 9) are in each case embedded in a wave guide structure.

3. The laser device as claimed in claim 2, in which the wave guide structures are formed as LOC wave guides.

4. The laser device as claimed in claim 1, in which the active layers (5, 9) are formed as quantum well structures.

5. The laser device as claimed in claim 1, in which the distance between two active layers (5, 9) that are adjacent in the vertical direction is less than 100 μm.

6. The laser device as claimed in claim 5, in which the distance between two active layers (5, 9) that are adjacent in the vertical direction is less than 20 μm.

7. The laser device as claimed in claim 5, in which the distance between two active layers (5, 9) that are adjacent in the vertical direction is less than 5 μm.

8. The laser device as claimed in claim 1, in which the cooling element (2) is a microchannel cooler.

9. The laser device as claimed in claim 1, in which the semiconductor body is soldered or adhesively bonded onto the cooling element (2).

10. The laser device as claimed in claim 1, in which the semiconductor body is clamped onto the cooling element (2).

11. The laser device as claimed in claim 10, in which a means containing carbon nanotubes is arranged between semiconductor body and cooling element (2).

12. The laser device as claimed in claim 1, in which the optical output power during operation is overall greater than 100 W.

13. The laser device as claimed in claim 1, in which an optical system arranged downstream of the active layers (5, 9) in the radiating direction is arranged on the cooling element (2).

14. The laser device as claimed in claim 1, in which the active layers (5, 9) arranged vertically one above the other are in each case electrically connected in series by means of a tunnel junction (7).

15. The laser device as claimed in claim 1, in which the optical output power during operation is overall greater than 200 W.

* * * * *